(12) United States Patent
Kilic

(10) Patent No.: US 11,049,986 B2
(45) Date of Patent: Jun. 29, 2021

(54) SOLAR CELL AND A SOLAR PANEL FOR GENERATING ELECTRICAL POWER FROM SUNLIGHT

(71) Applicant: Hat Teknoloji A.S., Istanbul (TR)

(72) Inventor: Halil Kilic, Istanbul (TR)

(73) Assignee: Hat Teknoloji A.S., Istanbul (TR)

( * ) Notice: Subject to any disclaimer, the term of this patent is extended or adjusted under 35 U.S.C. 154(b) by 167 days.

(21) Appl. No.: 16/477,684

(22) PCT Filed: Dec. 12, 2017

(86) PCT No.: PCT/TR2017/050652
§ 371 (c)(1),
(2) Date: Jul. 12, 2019

(87) PCT Pub. No.: WO2018/203865
PCT Pub. Date: Nov. 8, 2018

(65) Prior Publication Data
US 2019/0363207 A1 Nov. 28, 2019

(30) Foreign Application Priority Data
Jan. 12, 2017 (TR) .................................. 2017/00484

(51) Int. Cl.
*H01L 31/0352* (2006.01)
*H01L 31/0475* (2014.01)
*H01L 31/02* (2006.01)
*H01L 31/048* (2014.01)
*H01L 31/05* (2014.01)
*H01L 31/054* (2014.01)

(52) U.S. Cl.
CPC .. *H01L 31/03529* (2013.01); *H01L 31/02008* (2013.01); *H01L 31/048* (2013.01); *H01L 31/0475* (2014.12); *H01L 31/0504* (2013.01); *H01L 31/0547* (2014.12)

(58) Field of Classification Search
CPC ........... H01L 31/0475; H01L 31/02008; H01L 31/03529; H01L 31/048; H01L 31/0504
See application file for complete search history.

Primary Examiner — Lindsey A Bernier
(74) Attorney, Agent, or Firm — Young Basile Hanlon & MacFarlane, P.C.

(57) ABSTRACT

A solar cell is made of semiconductor material for generating electrical power from solar power and has a first solar unit comprising at least one doped substrate. Accordingly, said first solar unit comprises a first doped substrate; a second doped substrate is provided on said first doped substrate in a shifted manner in order to define a first junction area in between; a third doped substrate is provided under said second doped substrate in a shifted manner in order to define a second junction area in between; a first dielectric region provided between the first doped substrate and the third doped substrate, and at least one of said doped substrates is configured in a manner forming a voltage difference between the first doped substrate and the third doped substrate.

20 Claims, 19 Drawing Sheets

SOLAR CELL AND A SOLAR PANEL FOR GENERATING ELECTRICAL POWER FROM SUNLIGHT

CROSS REFERENCE TO RELATED APPLICATION

The present application claims priority to Turkish Patent Application No. 2017-00484, filed Jan. 12, 2017, incorporated herein in its entirety.

TECHNICAL FIELD

The present invention relates to solar cells which generate electrical power from solar power and solar panels comprising said solar cells.

BACKGROUND

Solar panels generate electrical power from solar power thanks to the solar cells included therein. The solar cells in the present art comprise two doped semiconductor silicon layers in plate form placed one above the other in a manner defining a junction area in between. Since one of said layers is n-type doped silicon and the other layer is p-type doped silicon, there is voltage difference in between. Photons absorbed by one layer provide movement of the electrons existing here and transmitting through the junction area and displacing in a manner placing to the holes existing on the other layer, and thus, the photons provide current flowing by means of a conductor in the opposite direction of the electrons from one to the other one. Since these layers absorb only the lights at a specific wavelength, the efficiency thereof for transforming the received sunlight to electricity is not at the desired efficiency level. The orientation of the sunlight with respect to the arrival angle is changed by means of additional mechanisms, and the efficiency can be increased partially.

In the American patent with no US2016336478, a tandem solar cell structure is mentioned comprising pluralities of plate formed layers. In such solar cells, a part of the light is absorbed at the upper layer, and the remaining part advances towards the lower layers, and it is partially absorbed by these layers. Thus, by means of the lower layers, the light in different wavelengths is partially absorbed.

As a result, because of all of the abovementioned problems, an improvement is required in the related technical field.

SUMMARY

The present invention relates to a solar cell and a solar panel comprising said solar cells, for eliminating the above mentioned disadvantages and for bringing new advantages to the related technical field.

An object of the present invention is to provide a solar cell having absorbing capability in the increased bandwidth and a solar panel formed by said solar cells. Another object of the present invention is to provide a solar cell where the surface area subjected to sun is increased and a solar panel formed by said solar cells.

Another object of the present invention is to provide a solar cell which can generate more electrical power in watt/m$^2$ and a solar panel formed by said solar cells.

Another object of the present invention is to provide a solar cell which can receive sunlight through all angles in an effective manner and a solar panel formed by said solar cells.

Another object of the present invention is to provide a solar cell where all layers can receive sunlight in an effective manner though the solar cell has a layered structure and a solar panel formed by said solar cells.

In order to realize all of the abovementioned objects and the objects which are to be deducted from the detailed description below, the present invention is a solar cell made of semiconductor material for generating electrical power from solar power and having a first solar unit comprising at least one doped substrate. The subject matter solar cell is characterized in that said first solar unit comprises a first doped substrate; a second doped substrate is provided on said first doped substrate in a shifted manner in order to define a first junction area in between; a third doped substrate is provided under said second doped substrate in a shifted manner in order to define a second junction area in between; a first dielectric region provided between the first doped substrate and the third doped substrate, and at least one of said doped substrates is configured in a manner forming a voltage difference between the first doped substrate and the third doped substrate. Thus, the substrates positioned under a doped substrate can directly receive daylight, and a more rapid electron flow can be provided thanks to the reduced junction area resulting from the connection in a shifted manner.

In a preferred embodiment of the invention, said first solar unit moreover comprises a fourth doped substrate placed under or above or next to said third doped substrate in order to define a third junction area in between in a manner not contacting the second doped substrate. In another preferred embodiment of the invention, said first solar unit moreover comprises a fifth doped substrate placed under or above or next to said first doped substrate in order to define a fourth junction area in between in a manner not contacting the second doped substrate or the fourth doped substrate.

In another preferred embodiment of the invention, the doped substrates of the first solar unit are positioned with respect to each other in a manner defining a stair configuration which rises upwardly and/or which lowers downwardly. Thus, sun rays, coming from different angles, can also be absorbed by the side faces, front faces and intermediate faces of the doped substrates in addition to the upper faces of the doped substrates.

In another preferred embodiment of the invention, at least one of said doped substrates is configured in a manner forming a voltage difference between the two doped substrates at the two opposite ends of the first solar unit. Thus, when the doped substrates between the two opposite ends absorb light, thanks to the electrons moved by the photons, current can flow through a conductor provided between these two opposite ends.

In another preferred embodiment of the invention, a second solar unit is provided which is similar to the first solar unit, and said second solar unit is connected to the first solar unit in a manner defining an intermediate junction area with the fourth doped substrate or the fifth doped substrate of the first solar unit by means of one of its own doped substrates.

In another preferred embodiment of the invention, the first solar unit and the second solar unit are connected in an electrically serial or parallel manner with respect to each other. Since each solar unit functions like a battery, placement can be provided in accordance with current and voltage needs.

In another preferred embodiment of the invention, at least one of the doped substrates is doped in a different proportion from the others in order to form said voltage difference.

In another preferred embodiment of the invention, at least one of the doped substrates is made of a different material from the others in order to form said voltage difference.

In another preferred embodiment of the invention, at least one of the doped substrates is configured in a manner absorbing a different wavelength range from the others. Thus, absorption can be provided in the widened wavelength range.

In another preferred embodiment of the invention, parallel lines are provided which have pluralities of solar units where each one is connected in a serial manner, and said lines are placed in a manner partially or completely closing the face of the solar cell which is subjected to sun.

In another preferred embodiment of the invention, the parallel lines are configured such that the voltage difference in between is 0. Thus, the solar units provided in parallel lines are prevented from creating opposite directional battery effect and affecting the voltage, formed at the mutual ends of the parallel lines, in a negative manner.

In another preferred embodiment of the invention, at least one of the doped substrates comprises at least two lower substrates having different doping proportions.

In another preferred embodiment of the invention, pluralities of solar units are provided which are connected serially to each other and said solar units are placed in a manner partially or completely closing the face of the solar cell which is subjected to sun.

In another preferred embodiment of the invention, a diagonal straight line between the second junction area and third junction area or between the first junction area and the fourth junction area extends in a manner forming an acute angle with respect to extension surfaces of the junction areas.

In another preferred embodiment of the invention, said acute angle is between 5° and 45°.

In another preferred embodiment of the invention, the length of the junction area between two joined doped substrates is equal to half of the length of the doped substrate or is smaller than half of the length of the doped substrate.

In another preferred embodiment of the invention, the width of the junction area between two joined doped substrates is equal to the width of the doped substrate or is smaller than the width of the doped substrate.

In another preferred embodiment of the invention, at least one junction area length is different from other junction area lengths.

In another preferred embodiment of the invention, all junction area lengths are equal to each other.

In another preferred embodiment of the invention, at least one flat face of each doped substrate is in a prismatic form which provides formation of a junction area with the adjacent doped substrate.

In another preferred embodiment of the invention, the areas which remain between all doped substrates are filled with dielectric material. Said dielectric filling material is preferably transparent.

In another preferred embodiment of the invention, an outer layer is provided which coats said solar cell.

In another preferred embodiment of the invention, at least one line is placed onto at least one other line and the section between the lines placed one above the other is filled with said transparent dielectric filling material.

The present invention moreover relates to a solar panel formed by pluralities of solar cells by means of connecting to each other in a serial and/or parallel manner through the first terminals and the second terminals. Thus, the solar units are placed one above the other in the form of layers such that there is transparent filling material in between and light absorbance can be provided in the range of widened wavelength.

DETAILED DESCRIPTION

In this detailed description, the subject matter is explained with references to examples without forming any restrictive effect only in order to make the subject more understandable.

As known, solar panels (600) comprise pluralities of solar cells (10), and the solar cells (10) are obtained from solar units (100). The present invention relates to solar units (100) designed with a novel architecture, solar cells (10) comprising said solar units (100) and solar panels (600) comprising said solar cells (10).

Figure 1:
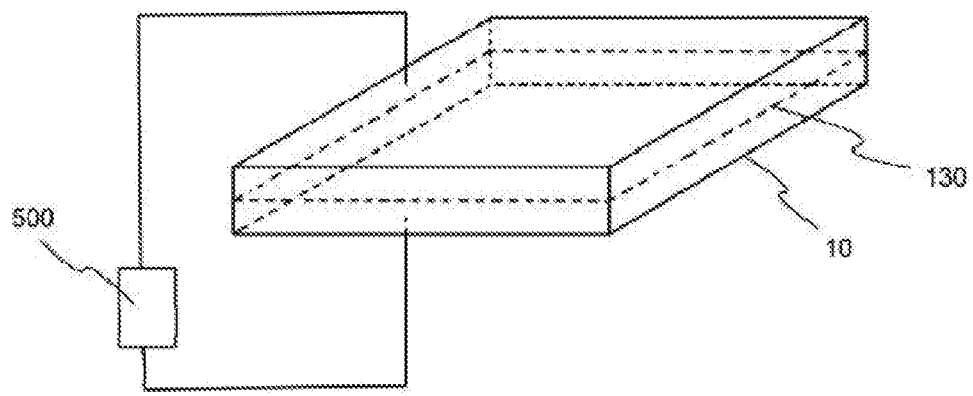
In FIG. 1, a representative view of a solar cell in the prior art is given.
Figure 2A:
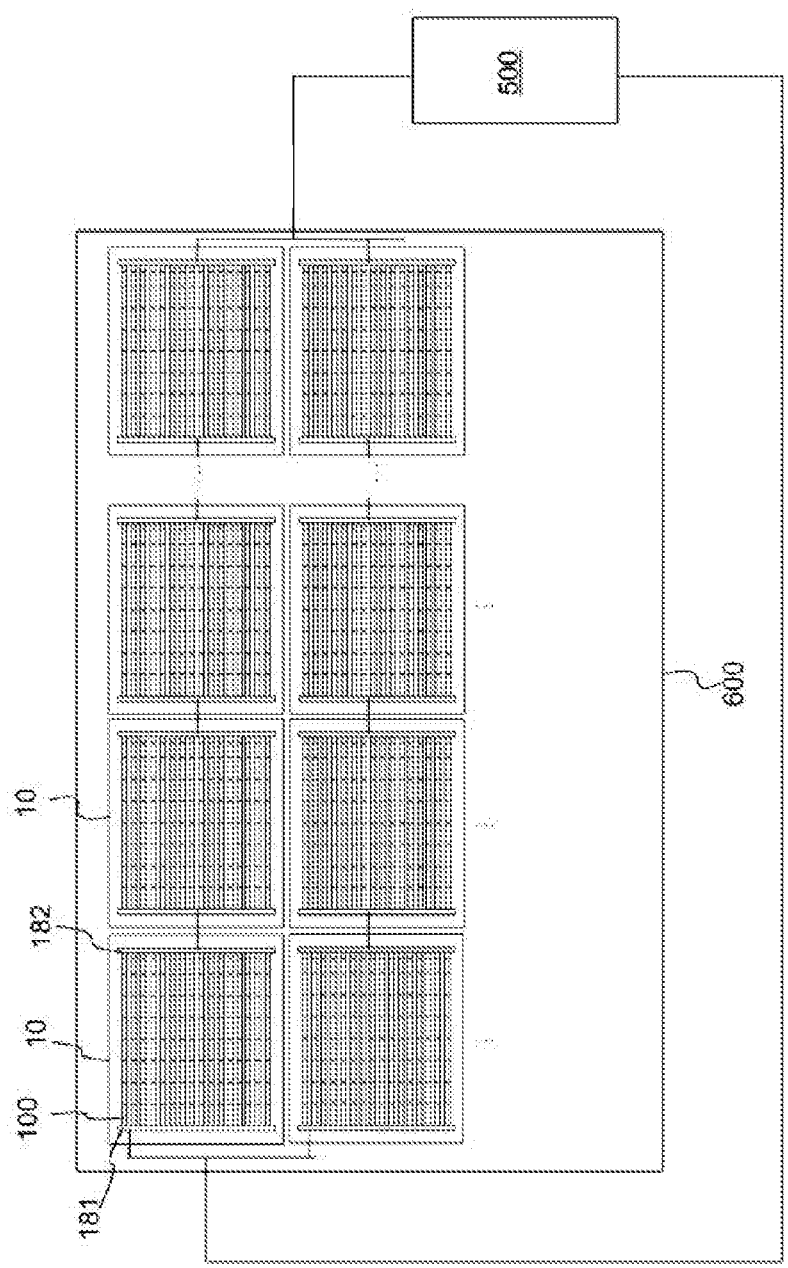
in FIG. 2a, a representative top view of the solar panel comprising solar cells is given.
Figure 2B:
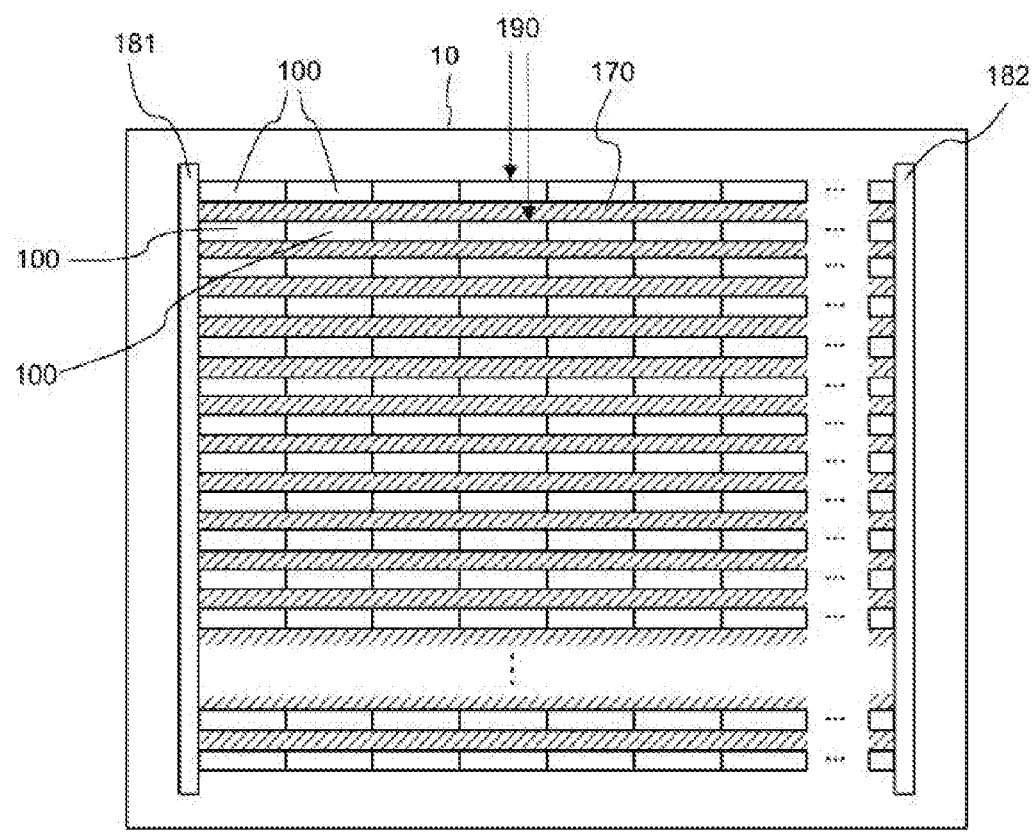
in FIG. 2b, a representative top view of the solar cell is given.

With reference to FIGS. 2a and 2b, the solar cell (10) essentially comprises a first terminal (181) and a second terminal (182); and pluralities of solar units (100) connected in a serial and/or parallel manner with respect to each other between said first terminal (181) and said second terminal (182) and where each of said solar units (100) generates electricity from the sunlight received. The solar units (100) basically comprise doped substrates (110) which are in prismatic form and said doped substrates (110) comprise at least one flat surface in order to form at least one junction area by means of the adjacent doped substrate (110). The doped substrates (110) provided in the solar units (100) are embodied such that there is voltage difference between the first terminal (181) and the second terminal (182).

Figure 3A:
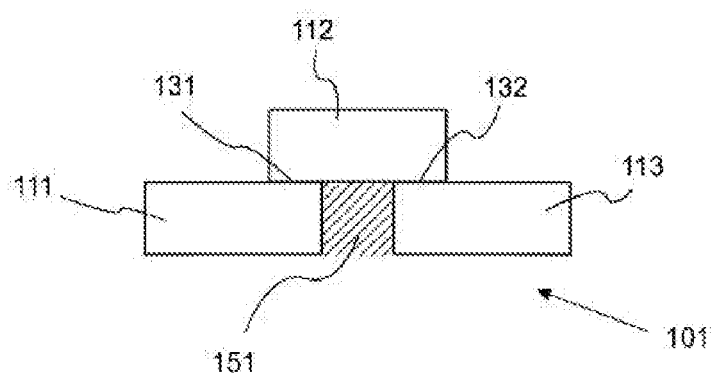
In FIG. 3a, a frontal representative view of the first solar unit is given.

Accordingly, with reference to FIG. 3a, a first solar unit (101) comprises a first doped substrate (111); a second doped substrate (112) placed on said first doped substrate (111) in a shifted manner, in other words, in a manner forming a stair and in a manner defining a first junction area (131) in between; a third doped substrate (113) placed under said second doped substrate (112) in a shifted manner and in a manner defining a second junction area (132) in between. A first dielectric region (151) is defined between the first doped substrate (111) and the second doped substrate (112). The first dielectric region (151) is filled with dielectric material. Said first solar unit (101) has stair configuration which is stepped upwardly from one side and which is stepped downwardly from one side.

In other words, the junction area is obtained by providing partial contact between the doped substrates (110). Said partial contact points, in other words, said junction areas (130) form an area which has a higher density when compared with the remaining of the doped substrates (110). Thus, the electrons, which exit a junction area (130), move in a less dense region until said electrons reach the other junction area (130). In other words, the electrons, which reach a high energy level in a dense area, advance in a much more rapid and less energy consuming manner, when compared with the less dense area in the art, until they reach a next dense area. This condition, in other words, the function of junction areas can be defined as an electron pump, which accelerates the electrons, which is a term which is specific for this specification.

In an exemplary embodiment, the first doped substrate (111) and the third doped substrate (113) are made of a material of which the light absorbance is higher when compared with the material of the second doped substrate (112).

Said doped substrates (110) are embodied in a manner forming a voltage difference between the first doped substrate (111) and the third doped substrate (113). For instance, the first doped substrate (111) can be n-type, the second doped substrate (112) can be p-type, and the third doped substrate (113) can be n-type. The first doped substrate (111) can be p-type, the second doped substrate (112) can be n-type and the third doped substrate (113) can be p-type. In both cases, the doping proportion of the first doped substrate (111) is different from the doping proportion of the third doped substrate (113). Thus, electron flow can be provided from the first doped substrate (111) towards the third doped substrate (113) or in the opposite direction as a result of the effect of the absorbed photons. The embodiment of the doped substrates (110) can be provided by means of doping at different proportions and/or by means of using different materials. Said doped substrates (110) in all embodiments can be obtained by means of doping materials like silisium, germanium and bismuth telluride with materials like magnesium, boron, selenium, zinc, lead, nitrogen.

Figure 3B:
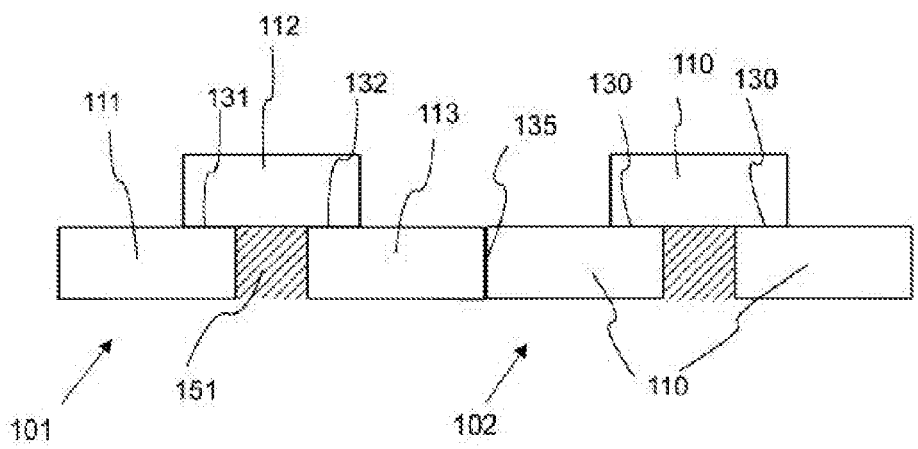
in FIG. 3b, a frontal representative view of the first solar unit and the second solar unit is given.

With reference to FIG. 3b, a second solar unit (102) which is in similar structure to the first solar unit (101) is connected through the side face of the third doped substrate (113) or the first doped substrate (111). Thus, pluralities of solar units (100) are brought side by side, and they provide repeating of this stair structure.

Figure 3C:
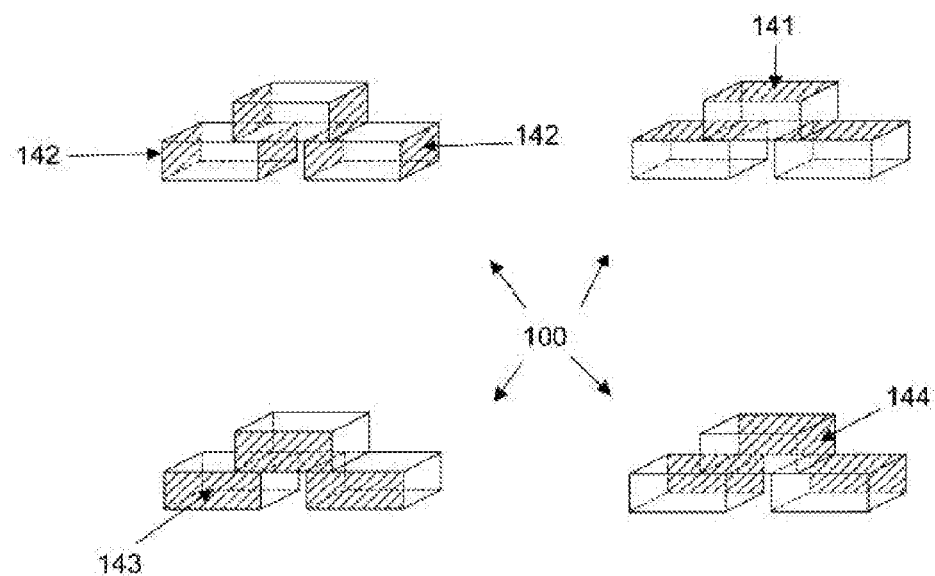
in FIG. 3c, a representative view showing the faces of the solar units is given.

With reference to FIG. 3c, the ceilings of the doped substrates (110) which are in prismatic form and provided in the solar units (100) in all embodiments are defined as the upper face (141), and the face provided on one side among the side faces provided in the same plane with each other is defined as the front face (143) and the face provided on the other side are rear face (144) and the other lateral faces are defined as the side faces (142).

Figure 4A:
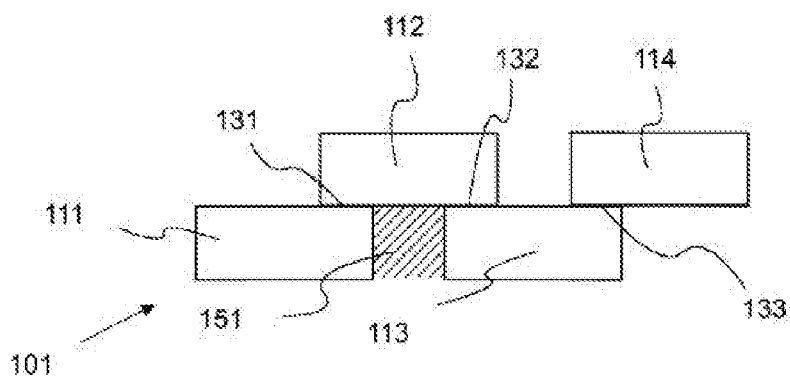
in FIG. 4a, a representative frontal view of the first solar unit is given.

With reference to FIG. 4a, in a possible embodiment, the first solar unit (101) comprises a fourth doped substrate (114) in a manner shifted onto the third doped substrate (113) and in a manner not contacting the second doped substrate (112). In other words, a volume is defined between the faces of the second doped substrate (112) and the fourth doped substrate (114) facing each other.

Figure 4B:
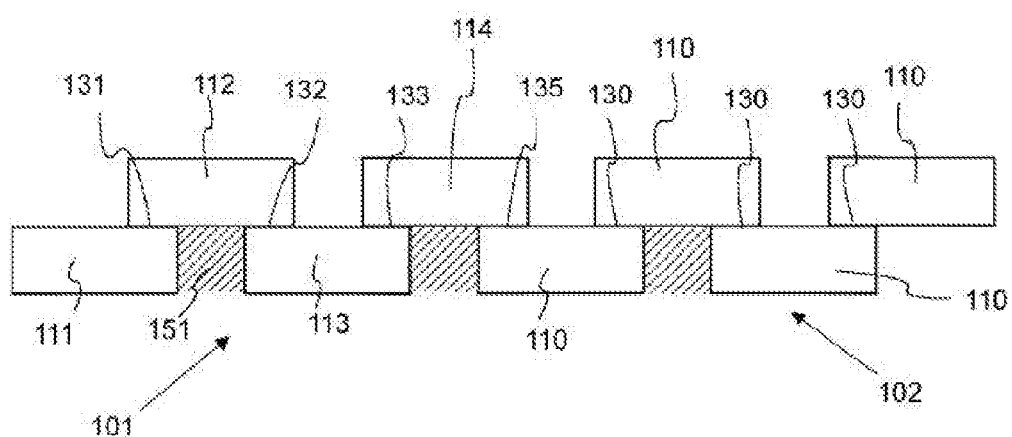
in FIG. 4b, a representative frontal view of the first solar unit and the second solar unit is given.

With reference to FIG. 4b, the solar cell (10), provided in this embodiment, comprises a second solar unit (102) which has a similar structure to the structure of first solar unit (101). Said second solar unit (102) is connected to the fourth doped substrate (114) of the first solar unit (101) in a manner defining an intermediate junction area (135) between the second solar unit (102) and one of its own doped substrates (110). Pluralities of second solar units (102) are arranged serially one after the other between the first terminal (181) and the second terminal (182), and thereby a line can be defined.

As a result, thanks to the invention, thanks to the cellular structure obtained at the level of solar units (100), a structure has been provided which permits very advanced design flexibility when compared with the solar cells (10) formed by one-piece plates as in the prior art. In more details, for instance, in the present invention, the substrates (110) doped by the suitable production method can be produced in different characteristics. Thus, depending on the application area, regions with different characteristics can be formed on the same solar cell (10). It is apparent that this cannot be provided by means of the layers of the plate structure formed by single type of materials as in the prior art.

Figure 5:
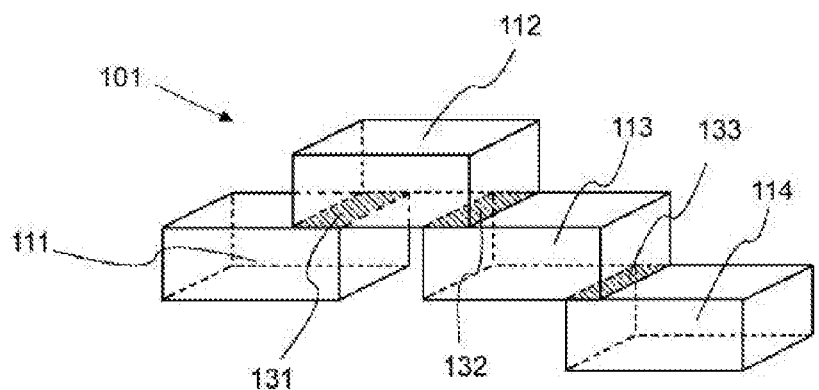
in FIG. 5, a representative isometric view of the first solar unit is given.

With reference to FIG. 5, in a possible embodiment, the first solar unit (101) may comprise a fourth doped substrate (114) placed in a shifted manner under the third doped substrate (113) and in a manner defining a third junction area (130) in between. The fourth doped substrate (114) continues the stair structure by means of stepping of the stair structure by correlating the third doped substrate (113) to the second doped substrate (112) in a shifted manner. Thus, a structure is formed which is similar to the stair structure which rises two steps upwardly on one side and which lowers three steps downwardly.

Figure 6:
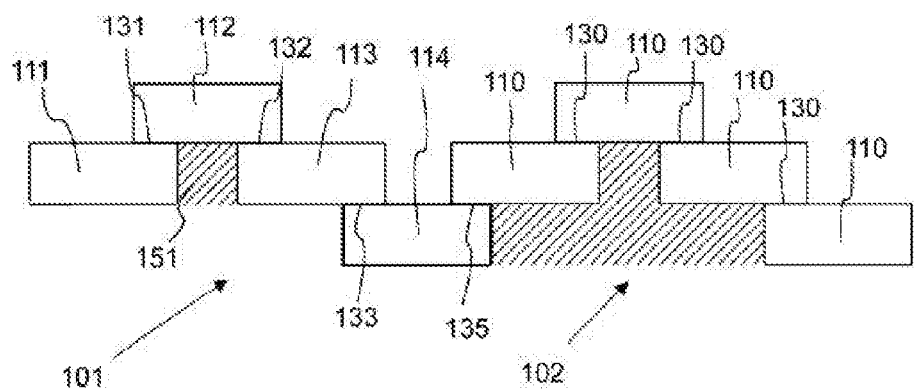
in FIG. 6, a representative frontal view of the first solar unit and the second solar unit is given.

With reference to FIG. 6, the solar cell (10) in this embodiment comprises a second solar unit (102) which has a structure which is similar to the structure of the first solar unit (101). Said second solar unit (102) is connected to the fourth doped substrate (114) of the first solar unit (101) in a manner defining an intermediate junction area (135) between the second solar unit (102) and one of its own doped substrates (110). Thus, the first solar unit (101) and the second solar unit (102) are arranged one after the other and they form a repeating stair structure.

Figure 7A:
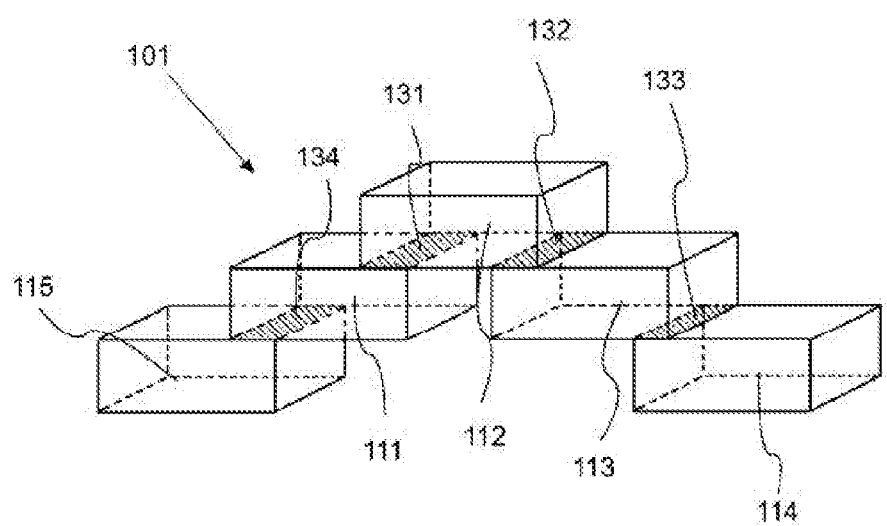
in FIG. 7a, a representative isometric view of the first solar unit is given.

With reference to FIG. 7a, in a possible embodiment, the first solar unit (101) comprises a fourth doped substrate (114) placed in a shifted manner under the third doped substrate (113) and in a manner defining a third junction area (133) in between. The fourth doped substrate (114) continues the stair structure by means of stepping of the stair structure by correlating the third doped substrate (113) to the second doped substrate (112) in a shifted manner. The first solar unit (101) moreover comprises a fifth doped substrate (115) placed in a shifted manner under the first doped substrate (111) and in a manner defining a fourth junction area (134) in between. The fifth doped substrate (115) continues the stair structure by means of stepping of the stair structure by correlating the first doped substrate (111) to the second doped substrate (112) in a shifted manner. Thus, a structure is formed which is similar to the stair structure which rises three steps upwardly on one side and which lowers three steps downwardly on the other side. Even if sunlight reaches the stair structure with acute angles, it can also be absorbed by the side faces (142) and the upper faces (141).

Figure 10:
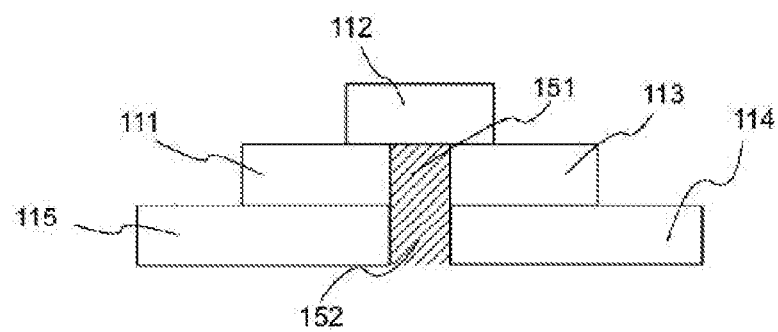
in FIG. 10, a representative frontal view of the first solar unit is given.

A second dielectric region (152) is defined between the fifth doped substrate (115) and the fourth doped substrate (114). The second dielectric region (152) is also filled with dielectric material. In this exemplary embodiment, the volume of the second dielectric region (152) is smaller than the volume of the first dielectric region (151). In an alternative embodiment as in FIG. 10, the volumes of the first dielectric region (151) and the second dielectric region (152) are equal to each other.

In the invention, the angle, formed between the extension plane of the junction areas (130) and the shortest imaginary straight line extending between two junction areas (130) between the doped substrates (110) positioned one above the other in staircase form, is an acute angle. Thanks to said acute angle, the direction of advancing of the electrons between two junction areas (130) is a direction which leads to minimum energy loss in this process. Together with the electron pump function described above, the advancing direction in this acute angle surprisingly increases the efficiency and operational activity of the solar unit (100).

Figure 7B:
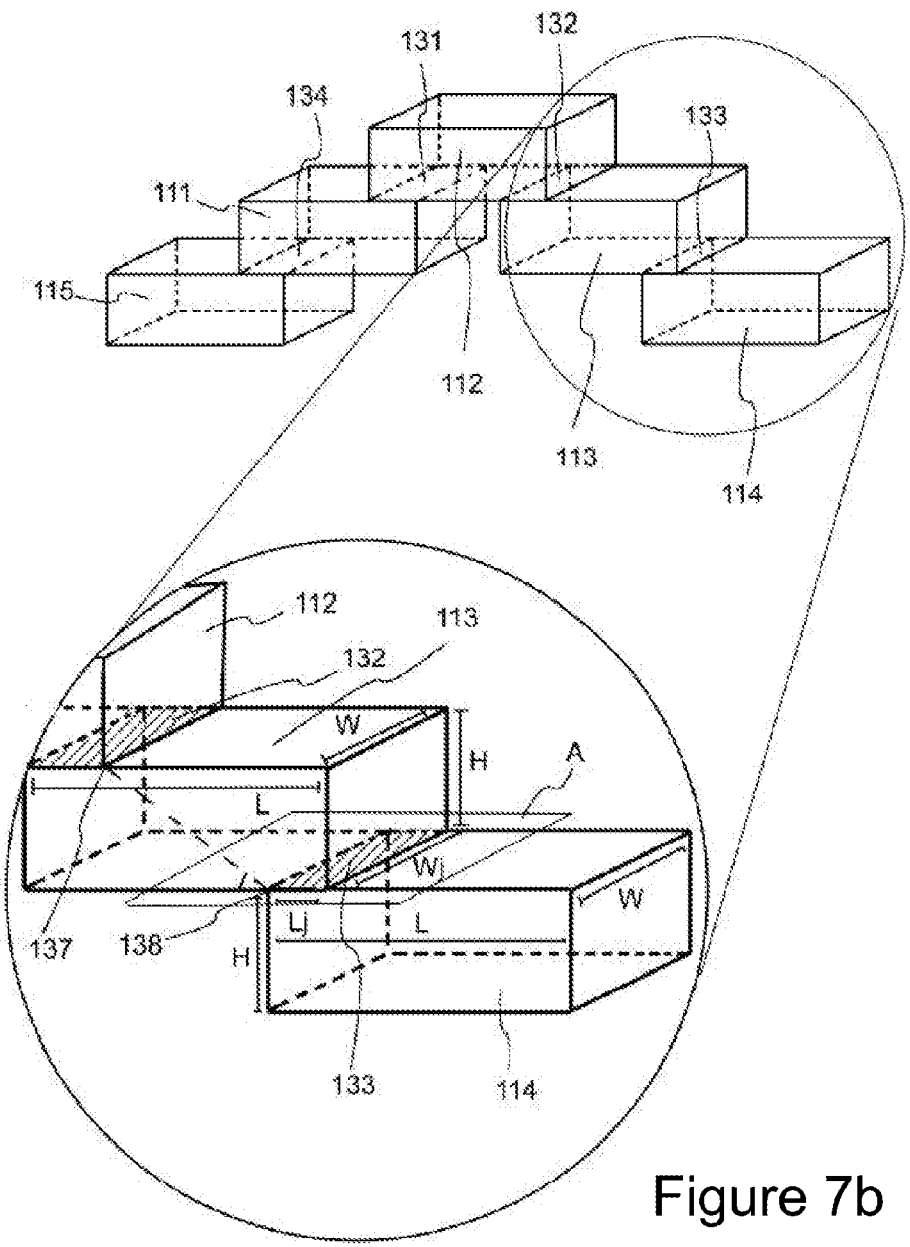
in FIG. 7b, a more detailed representative isometric view of the first solar unit is given.

In more details, with reference to FIG. 7b, the doped substrates (110) of the first solar unit (101) has been dimensioned and placed such that an imaginary straight line extending from the second junction area (132) to the surface of the third junction area (133) makes an acute angle with an extension surface (A) where the third junction area (133) extends. In more details, said imaginary straight line is provided between a first corner (137), which is one of the corners of the second junction area (132) positioned in a closer manner than the others to the third junction area (133), and a second corner (138) which is the corner of the third junction area (133) positioned in a closer manner than the others to said first corner (137). In other words, said straight line is the shortest possible straight line possible whose one end contacts the second junction area (132) and whose other end contacts the third junction area (133). The doped substrates (110) of said solar unit (100) has been dimensioned and placed such that the shortest imaginary straight line, which can be positioned between the first junction area (131) and the fourth junction area (134) in a manner contacting them, makes an acute angle with respect to the plane where the fourth junction area (134) extends.

Said narrow angle is preferably between 5° and 45° and again preferably 30° and 45°.

Figure 8:
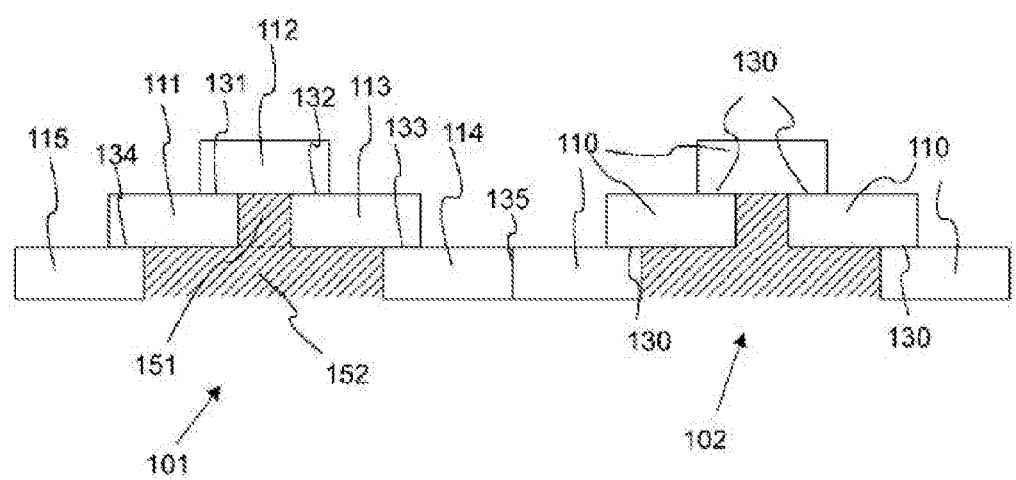
in FIG. 8, a representative frontal view of the first solar unit and the second solar unit is given.

With reference to FIG. 8, the solar cell (10) in this embodiment comprises a second solar unit (102) which is in similar structure to the first solar unit (101). Said second solar unit (102) is connected to the fourth doped substrate (114) of the solar unit (101) from the side face (142) in a manner defining an intermediate junction area (135) between one of its own doped substrates (110) and said second solar unit (102).

The length of the junction areas (Lj) is shorter than half of the doped substrate length (L).

Figure 9:
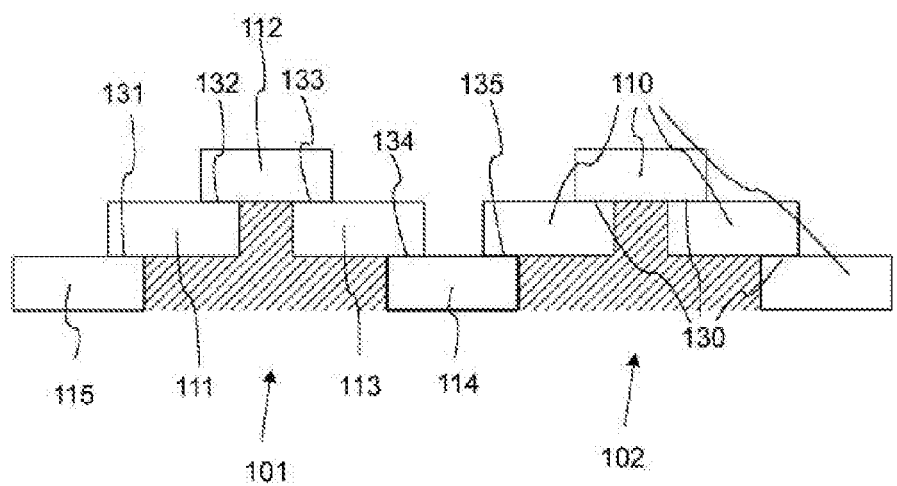
in FIG. 9, a representative frontal view of the first solar unit and the second solar unit is given.

With reference to FIG. 9, in a possible embodiment, the solar cell (10) comprises the first solar unit (101) provided in the embodiment given in FIG. 7a. The solar cell (10) moreover comprises a second solar unit (102) which is in similar structure to the first solar unit (101) provided in the embodiment given in FIG. 5. The second solar unit (102) is connected to the fourth doped substrate (114) or the fifth doped substrate (115) of said first solar unit (101) in a manner forming an intermediate junction area (135) by means of one of its doped substrates (110). Pluralities of second solar units (102) are added one after the other and they define a line (190) between the first terminal (181) and the second terminal (182).

Figure 11:
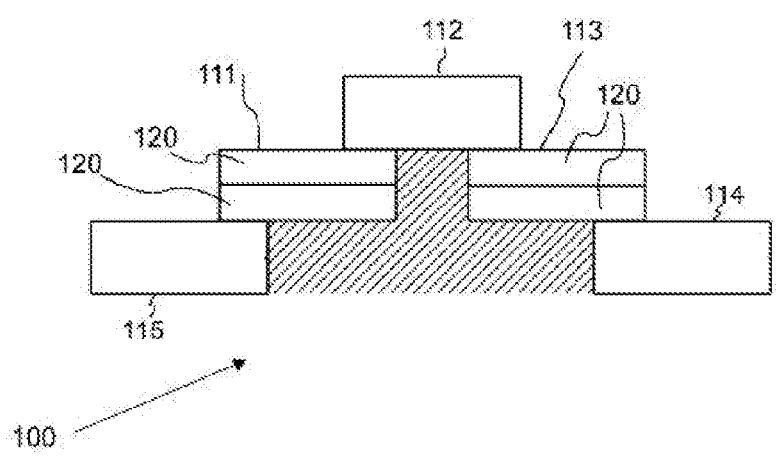
in FIG. 11, a representative frontal view of the first solar unit is given.

With reference to FIG. 11, in a possible embodiment, the first doped substrate (111) and/or third doped substrate (113) may comprise at least two lower substrates (120) obtained from different materials or doped at proportions which are different from each other.

In the abovementioned embodiments, the junction area width (Wj) is equal to the doped substrate width (W) or smaller than the doped substrate width (W).

Figure 12:
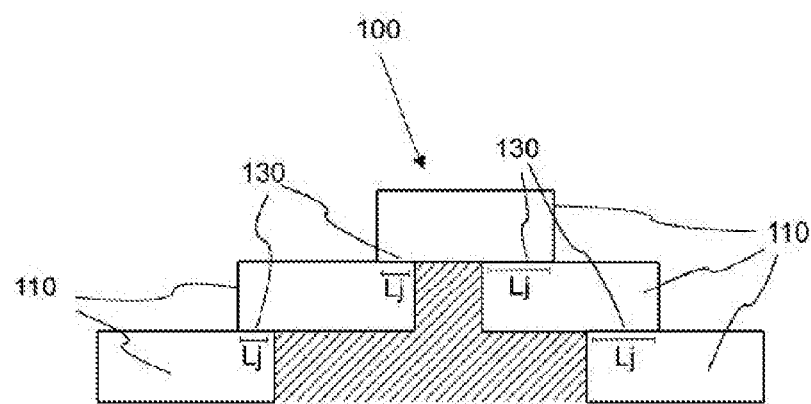
in FIG. 12, a representative frontal view of the first solar unit is given.

As in FIG. 12, the junction areas (130) can be at lengths which are different from each other.

Pluralities of solar units (100) are arranged one after the other between the first terminal (181) and the second terminal (182) as described in the embodiments given above and they define the lines (190). Pluralities of lines (190) can be provided which are connected to each other in a parallel manner inside a solar cell (10). The doped substrates (110) and the solar units (100) are embodied such that the voltage difference between each line (190) parallel to each other is equal to 0. Thus, the voltage, formed between the mutual ends which provide parallelism with the solar units (100) which are parallel to the solar units (100) where each one functions as a battery, is prevented from decreasing.

Figure 13A:
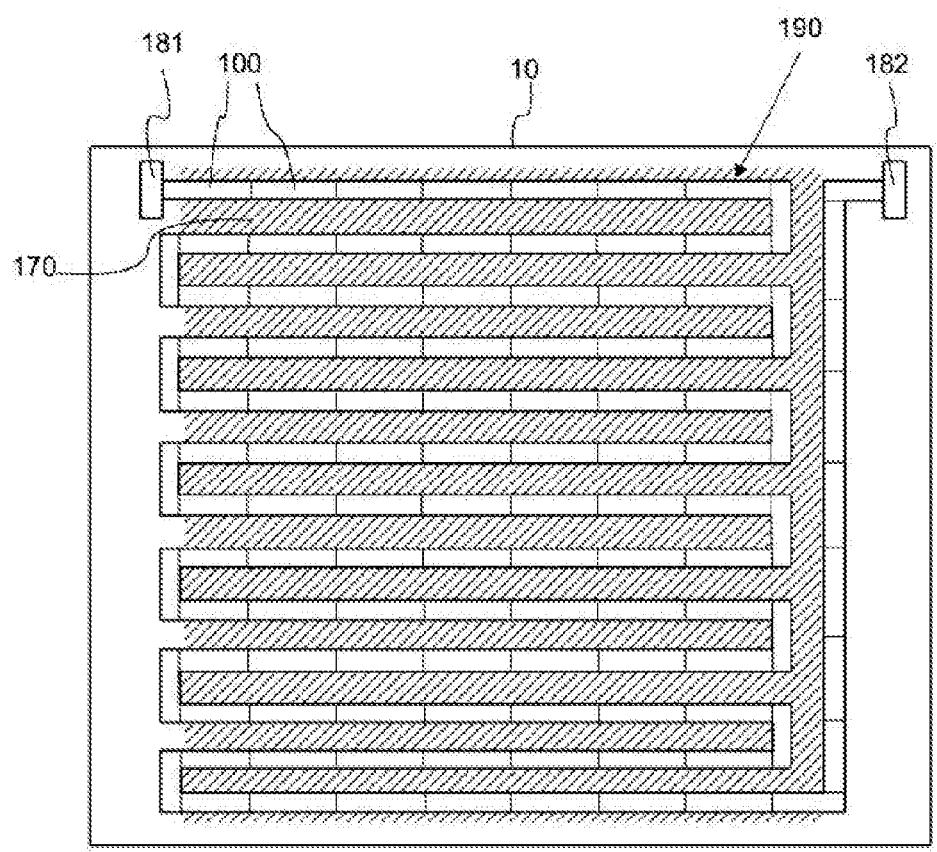
in FIG. 13a, a representative upper view of the solar cell is given.
Figure 13B:
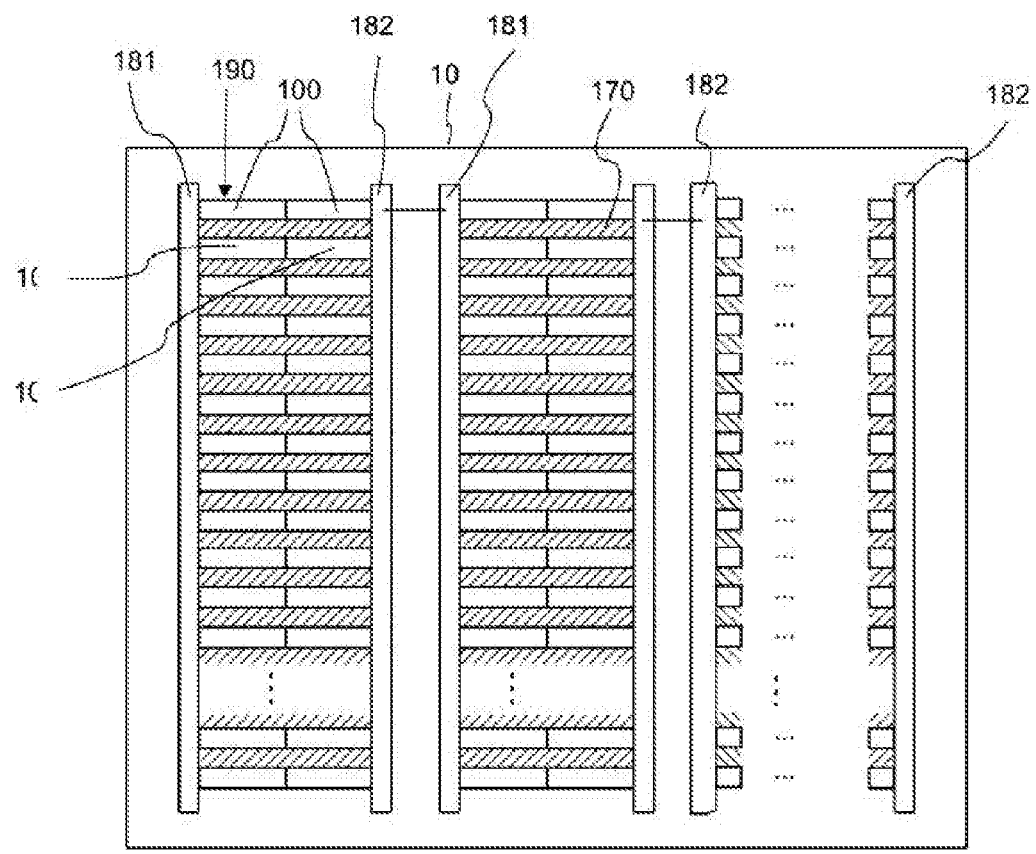
in FIG. 13b, a representative upper view of the solar cell is given.

Said line (190) or lines (190) are arranged on the surface of the solar cell (10) in accordance with the amount of voltage or current desired to be taken from the solar cell (10). With reference to FIG. 13a, in a possible embodiment, a line (190), comprising the solar units (100) connected serially to each other, is placed between the first terminal (181) and the second terminal (182) in a manner coating the face of the solar cell (10) facing the sun. In this placement, the line (190) is curled in a form similar to meander form and it is provided in a form partially coating said face. Thus, since the solar units (100) generating current are connected in a serial manner, the total of the currents generated by each one can be accessed between the terminals. In an embodiment as in FIG. 2, lines (190) connected in a parallel manner to each other are placed between the first terminal (181) and the second terminal (182). In another possible embodiment of the invention as in FIG. 13b, the lines (190) are arranged by being connected by means of pluralities of first terminals (181) and second terminals (182) onto the surface of the solar cell (10) facing the sun in a serial and parallel manner.

Figure 14:
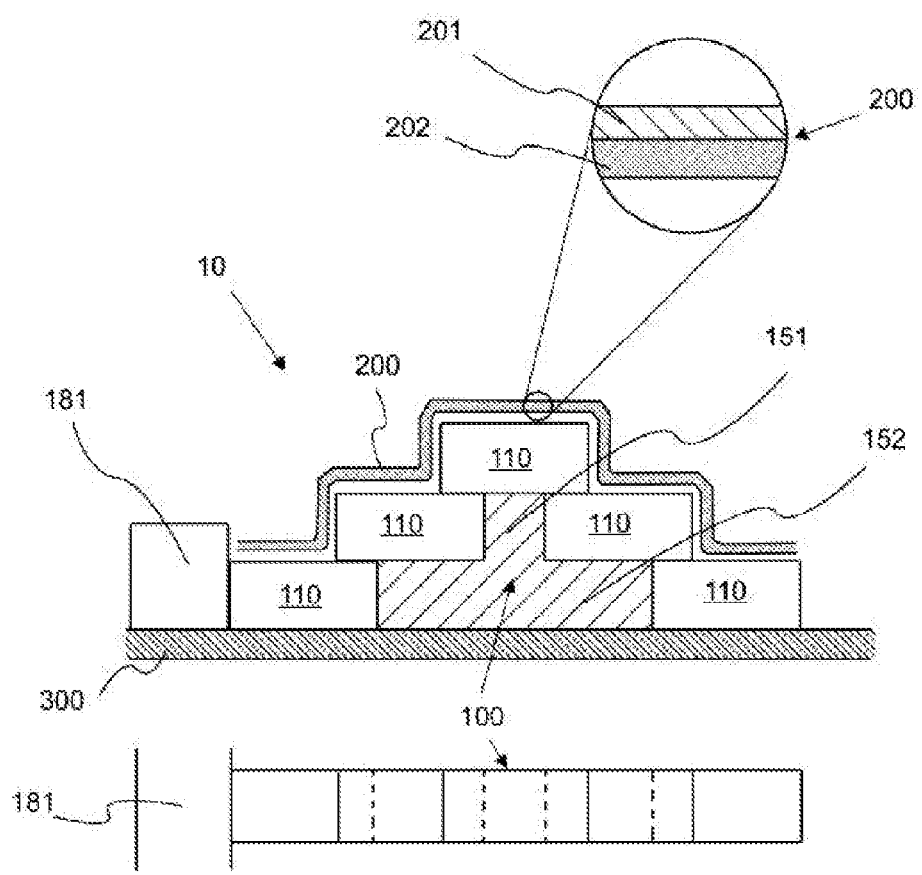
in FIG. 14, a representative view of a cross section of the solar cell and a representative upper view of this cross section are given.

With reference to FIG. 14, the solar cells (10) moreover comprise a carrying layer (300) and an outer layer (200). The solar units (100) are positioned on said carrying layer (300). The carrying layer (300) can comprise crystal glass or it can be made of flexible materials in accordance with the usage areas of the solar cells (10). The outer layer (200) is connected to the solar units (100) in a manner coating the solar units (100). The outer layer (200) comprises a protective layer (201) and a single direction reflective layer (202). The protective layer (201) is positioned at the outermost section when compared with the solar units (100) and preferably comprises a material which repels dust. The single direction reflective layer (202) is positioned under the protective layer (201) and it transmits the rays which arrive at the solar units (100) from outside and it provides reflecting back of the rays, reflected outwardly from the solar units (100), towards the solar units (100) from its own surface. Thus, the light, partially reflected from the solar units (100), is transferred back to the solar units (100).

At least one of the solar units (100) is embodied in a manner absorbing the light at a wavelength which is different from the other solar units (100). In more details, at least one of the doped substrates (110) is embodied in a manner absorbing the light at a wavelength which is different from the other doped substrates (110). This embodiment can be realized by means of making doped substrates (110) from other materials, doping with different materials or doping at different amounts. Thus, absorption can be provided at a wide spectrum when compared with the solar cells (10) and solar panels existing in the present art.

With reference to FIG. 2 and FIG. 13a, dielectric filling (170) is filled between the solar units (100) positioned in a parallel manner to each other. The dielectric filling (170) is preferably made of a material which at least partially transmits light. Thus, the electrical contact of parallel solar units (100) with each other is prevented, and the solar units (100) are provided to absorb light through the front faces (143) and the rear faces (144) thereof. The distance between the parallel solar units (100) is provided at a width which prevents electrical flow in between. In this exemplary embodiment, the distance between the parallel solar units (100) is equal to the width of the solar units (100) or greater than the width of the solar units (100). As a result, the solar units (100) can absorb sunlight through the upper face (141) and the side faces (142) thanks to the stair-like structure thereof and through the rear face of the upper face (141), the rear face (144) and the front face (143) thanks to the transparent filling material (170) between the parallel ones thereof.

Figure 15:
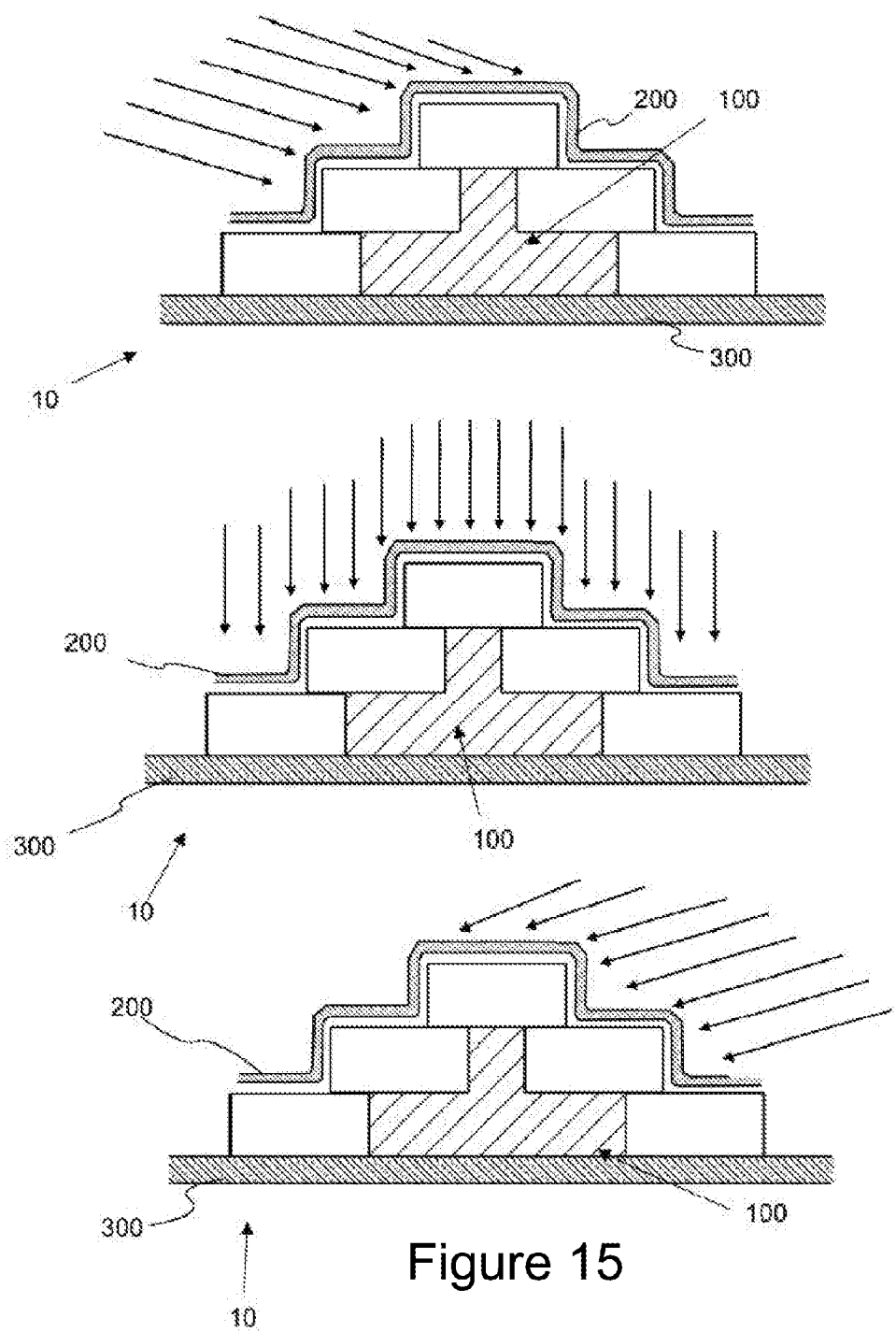
in FIG. 15, the representative views of the cross section of the solar cell which receives a light from different angles are given; and in FIG. 16, the representative isometric views of the cross section of a possible embodiment of the solar cell are given.

With reference to FIG. 15, the solar units (100) can receive lights arriving at different angles at different hours of the day since the solar units (100) have upwardly rising and downwardly lowering stair form. Thanks to the stair structure, the doped substrates (110) can absorb light through the exposed side faces. Moreover, they can absorb daylight when the sun is at different positions in a day. Thus, the need for movement of the solar cells (10) or the solar panels (600), comprising these cells, by means of an external effect in order to receive light from the sun at the correct angle is eliminated.

Figure 16:
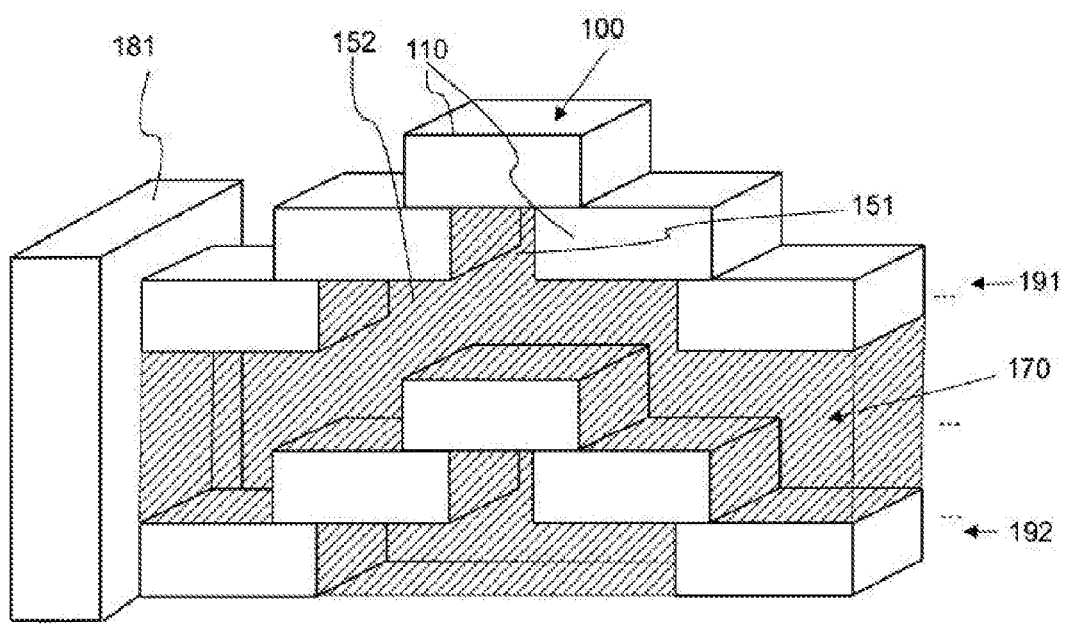

With reference to FIG. 16, in a possible embodiment of the present invention, at least one of the lines (190) can be arranged in a manner positioned on the other one. Said dielectric filling (170) is filled between the lines (190) positioned one above the other. Thus, the light transmitted through a first line (191) positioned above can reach a second line (192) provided below and it can be absorbed by this second line (192). In this exemplary embodiment, the first dielectric region (151) and the second dielectric region (152) are made of material which at least partially transmits light.

Pluralities of solar cells (10) are connected to each other in a serial and/or parallel manner through the first terminals (181) and the second terminals (182) thereof and they form a solar panel (600) and thus, they can feed a load (500) connected to the ends thereof.

The doped substrates (110) and the solar units (100) can have nano-metric dimensions. The widths (W) of the doped substrates can be between 2 nm and 2 mm. In an exemplary embodiment, in an area of 2 cm$^2$, there are 4 million solar units (100). Placement of doped substrates (110) one above the other in a shifted manner can be realized by means of the semiconductor device production methods known in the art.

The protection scope of the present invention is set forth in the annexed Claims and cannot be restricted to the illustrative disclosures given above, under the detailed description. It is because a person skilled in the relevant art can obviously produce similar embodiments under the light of the foregoing disclosures, without departing from the main principles of the present invention.

REFERENCE NUMBERS

10 Solar cell
100 Solar unit
101 First solar unit
110 Doped substrate
111 First doped substrate
112 Second doped substrate
113 Third doped substrate
114 Fourth doped substrate
115 Fifth doped substrate
W Doped substrate width
L Doped substrate length
H Doped substrate height
102 Second solar unit
120 Lower substrate
130 Junction area
131 First junction area
132 Second junction area
133 Third junction area
134 Fourth junction area
135 Intermediate junction area
141 Upper face
142 Side face
143 Front face
144 Rear face
Lj Junction area length
Wj Junction area width
137 First corner
138 Second corner
A Extension plane
150 Dielectric region
151 First dielectric region
152 Second dielectric region
170 Dielectric filling
181 First terminal
182 Second terminal
190 Line
191 First line
192 Second line
200 Outer layer
201 Protective layer
202 Single directional reflective layer
300 Carrying layer
500 Load
600 Solar panel

The invention claimed is:

1. A solar cell made of semiconductor material for generating electrical power from solar energy and having a first solar unit comprising first doped substrate, a second doped substrate and a third doped substrate; wherein the second doped substrate is provided directly on said first doped substrate in a shifted manner in order to define a first junction area in between; wherein the third doped substrate is provided directly under said second doped substrate in a shifted manner in order to define a second junction area in between; wherein a first dielectric region is provided between the first doped substrate and the third doped substrate, and wherein a voltage difference is formed between the first doped substrate and the third doped substrate;

wherein the length of the first junction area is smaller than the length of each of the first doped substrate and the second doped substrate; and wherein the length of the second function area is smaller than the length of each of the second doped substrate and the third doped substrate.

2. The solar cell according to claim 1, wherein said first solar unit further comprises a fourth doped substrate placed directly under or directly above or directly next to said third doped substrate in order to define a third junction area in between in a manner not contacting the second doped substrate.

3. The solar cell according to claim 2, wherein said first solar unit further comprises a fifth doped substrate placed directly under or directly above or directly next to said first doped substrate in order to define a fourth junction area in between in a manner not contacting the second doped substrate or the fourth doped substrate.

4. The solar cell according to claim 1, wherein the doped substrates of the first solar unit are positioned with respect to each other in a manner defining a stair configuration which rises upwardly and/or which lowers downwardly.

5. The solar cell according to claim 1, wherein a voltage difference is formed between two of the doped substrates at two opposite ends of the first solar unit.

6. The solar cell according to claim 3, wherein a second solar unit is directly connected to the first solar unit in a manner defining an intermediate junction area with the fourth doped substrate or the fifth doped substrate of the first solar unit.

7. The solar cell according to claim 6, wherein the first solar unit and the second solar unit are connected in an electrically serial or parallel manner with respect to each other.

8. The solar cell according to claim 1, wherein at least one of the doped substrates is doped in a different proportion from the others in order to form said voltage difference.

9. The solar cell according to claim 1, wherein at least one of the doped substrates is made of a different material from the others in order to form said voltage difference.

10. The solar cell according to claim 1, wherein at least one of the doped substrates is configured in a manner absorbing a different wavelength range from the others.

11. The solar cell according to claim 1, wherein parallel lines are provided which have pluralities of solar units where each one is connected in a serial manner.

12. The solar cell according to claim 11, wherein the parallel lines are configured such that the voltage difference in between is 0.

13. The solar cell according to claim 1, wherein pluralities of solar units are provided which are connected serially to each other.

14. The solar cell according to claim 1, wherein at least one of the doped substrates comprises at least two layers having different doping proportions.

15. The solar cell according to claim 1, wherein the length of the junction area between two joined doped substrates is equal to half of the length of each of the joined doped substrates or is smaller than half of the length of each of the joined doped substrates.

16. The solar cell according to claim 1, wherein the width of the junction area between two joined doped substrates is equal to the width of each of the joined doped substrates or is smaller than the width of each of the joined doped substrates.

17. The solar cell according to claim 1, wherein at least one junction area length is different from the other junction area lengths.

18. The solar cell according to claim 1, wherein all of the junction area lengths are equal to each other.

19. The solar cell according claim 1, wherein each doped substrate has at least one flat face which is in a prismatic form which provides formation of the junction area with the adjacent doped substrate.

20. The solar cell according to claim 1, wherein the dielectric region is filled with dielectric material, wherein said dielectric filling material is transparent.

* * * * *